(12) United States Patent
Janesick

(10) Patent No.: US 6,369,415 B1
(45) Date of Patent: Apr. 9, 2002

(54) BACK SIDE THINNED CCD WITH HIGH SPEED CHANNEL STOP

(75) Inventor: James R. Janesick, Huntingtom Beach, CA (US)

(73) Assignee: Pixel Vision, Inc., Lexington, KY (US)

(*) Notice: Subject to any disclaimer, the term of this patent is extended or adjusted under 35 U.S.C. 154(b) by 0 days.

(21) Appl. No.: 09/470,085

(22) Filed: Dec. 22, 1999

(51) Int. Cl.⁷ .................... H01L 27/148; H01L 29/768
(52) U.S. Cl. .................... 257/228; 257/223; 257/224; 257/230; 257/250
(58) Field of Search ................... 257/222–224, 257/228, 230, 249, 250

(56) References Cited

U.S. PATENT DOCUMENTS

| | | | | |
|---|---|---|---|---|
| 3,869,572 A | * | 3/1975 | Carter | 257/250 |
| 4,593,303 A | * | 6/1986 | Dyck et al. | 257/223 |
| 4,603,342 A | * | 7/1986 | Savoye et al. | 257/223 |
| 5,754,228 A | * | 5/1998 | Dyck | 257/228 |

* cited by examiner

*Primary Examiner*—Gene M. Munson
(74) *Attorney, Agent, or Firm*—John Smith-Hill; Smith-Hill and Bedell

(57) ABSTRACT

A back thinned CCD has at least first and second parallel n-signal channel segments and a p++ channel stop region between the signal channels.

19 Claims, 3 Drawing Sheets

BACK SIDE THINNED CCD WITH HIGH SPEED CHANNEL STOP

BACKGROUND OF THE INVENTION

This invention relates to a back side thinning charge-coupled device (CCD) with high speed channel stop.

A conventional unthinned CCD comprises a substrate of p+ silicon on which a layer of p− silicon is grown epitaxially. Using conventional implantation techniques, n− channels are formed in the front side of the epitaxial layer. The n− channels include signal channels for parallel (or vertical) registers and a signal channel for at least one serial (horizontal) register. P+ lateral channel stops are implanted between the signal channels of the parallel registers. An electrode structure is deposited over the front side of the epitaxial layer for controlling transfer of charge packets through the parallel registers and the serial register.

In order to transfer charge packets in the parallel registers of the conventional unthinned CCD, it is necessary to supply holes to the parallel registers so that displacement current can flow. For high speed operation, there must be a low resistance path for supplying holes to the parallel registers.

The p+ substrate is a good conductor and is connected to ground and therefore can sink and source holes efficiently. Although the p− epitaxial layer does not have a high conductivity, the geometry of the conventional unthinned device is such that there is a low resistance path between the substrate and the p+ channel stops, and accordingly holes can be supplied efficiently from ground to the n− signal channels via the p+ substrate, the p− epitaxial layer and the p+ channel stops.

The p+ lateral channel stop between two adjacent signal channels of the parallel registers isolates charge packets in one parallel register from an adjacent parallel register. Instead of providing a lateral channel stop between each two adjacent signal channels of the parallel registers, the channel stops may alternate with lateral antiblooming drains. A lateral antiblooming drain between two signal channels is formed by two p− barriers adjacent the signal channels respectively and an n+ region between the two p− barriers. The doping level in the p− barriers is selected so that the p− regions are depleted and the barriers have a slightly lower potential than the maximum potential barrier created in the signal channel by clocking the electrode structure. If the quantity of charge that is supplied to a transfer cell in the signal channel exceeds the capacity of the cell, excess charge will overflow the p− barrier into the n+ drain instead of overflowing into the adjacent transfer cell of the signal channel.

In the conventional unthinned CCD, the lateral antiblooming drains are connected to a reference potential through an n+ region which extends perpendicular to the signal channels outside the active area of the device. This arrangement is subject to disadvantage because it precludes the possibility of having dual serial registers, at opposite ends respectively of the parallel register.

In order to fabricate a back side thinned CCD, material of the p+ substrate is removed from the device at its back side so that the back side of the thinned device is much closer to the front side than is the case in an unthinned device. During thinning, material may be removed from the back side as far as the p− epitaxial layer. Consequently, the p+ lateral channel stops are no longer connected to ground through the low resistance path of the p− epitaxial layer and p+ substrate. The p+ lateral channel stops are connected to the p+ substrate outside the active area of the CCD and therefore can supply holes to the parallel registers, but the impedance of the p+ lateral channel stops is so high that they cannot provide holes at a sufficient rate for high speed operation of the device. Further, a potential difference exists along the p+ lateral channel stops so that the p+ channel stops do not efficiently ground the p− epitaxial layer. Consequently, the potential of the p− layer varies as the electrode structure is clocked, and this reduces the full well capacity of the transfer cells in the signal channel.

SUMMARY OF THE INVENTION

According to the present invention there is provided a back thinned CCD having at least first and second parallel n− signal channel segments and a p++ channel stop region between the signal channels.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
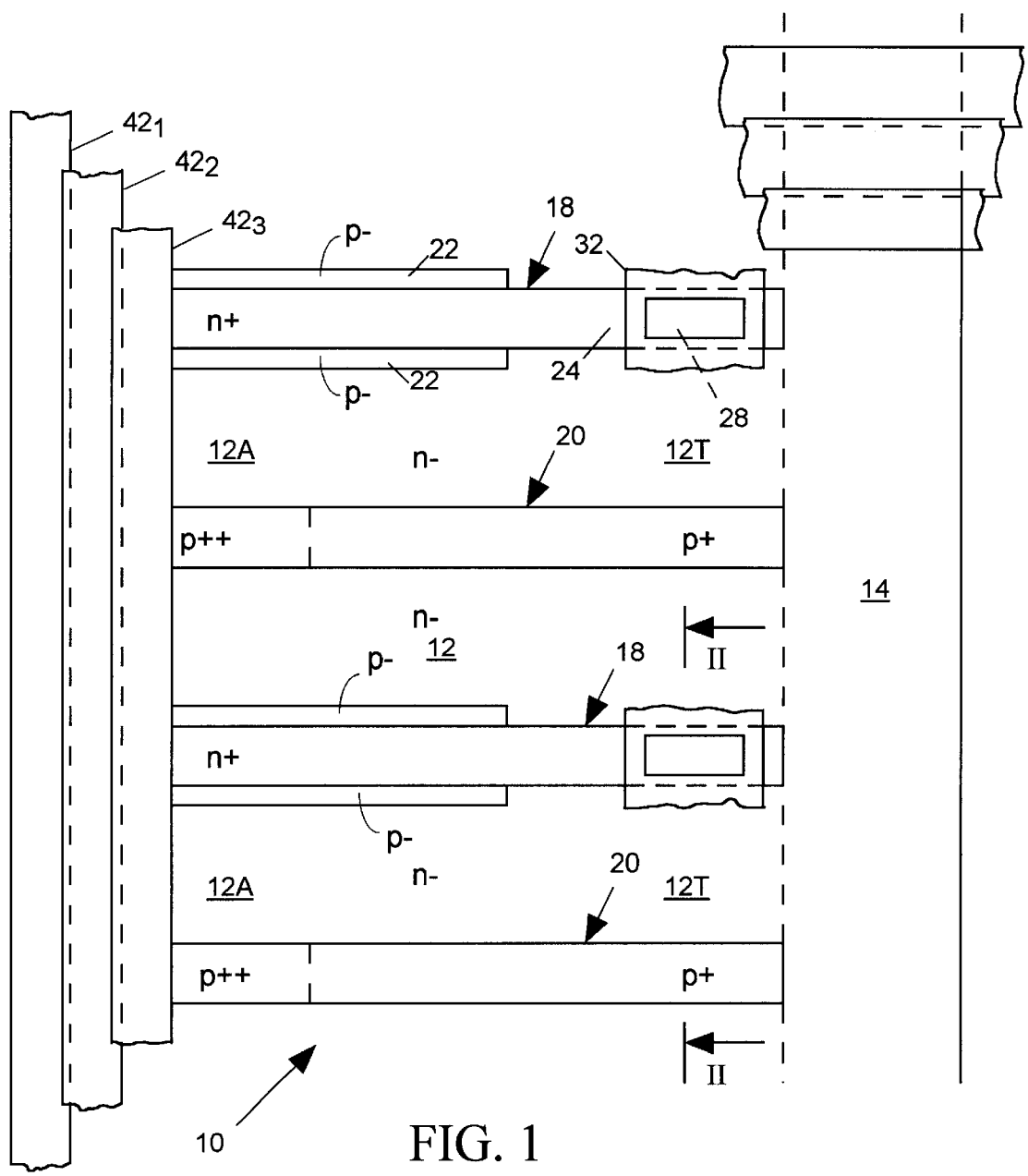
FIG. 1 is a schematic plan view of the front side of a backside thinned imaging CCD.
Figure 2:
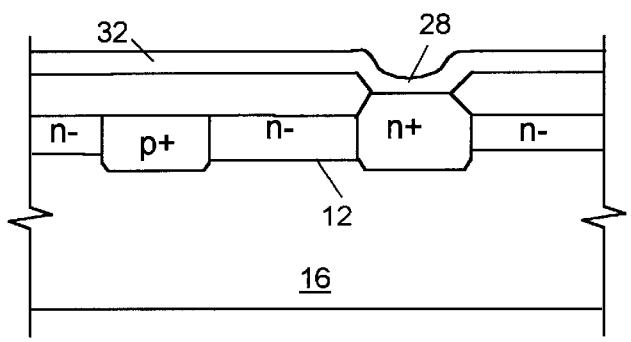
FIG. 2 is a sectional view on the line II—II of FIG. 1.

The CCD shown in FIG. 1 is a backside thinned CCD 10 having parallel registers 12 and a serial register 14 formed by respective segments of an n− signal channel in the front side of a p− epitaxial layer 16. Each parallel register 12 has an imaging or active region 12A in which charge is photo-electrically generated in use of the CCD and a transition or interface region 12T connecting the active region 12A to the serial register. Adjacent parallel registers are separated alternately by a lateral antiblooming drain 18 and a lateral channel stop 20. In accordance with the invention, adjacent the active region 12A of the parallel registers, the lateral channel stop 20 is composed of a highly doped region of p++ conductivity. Such a channel stop provides a low impedance path for supply of holes from the substrate to the parallel register over the whole length of the active region 12A of the parallel register, allowing high speed operation of the imaging CCD. The p++ region also supplies holes to the p− epitaxial layer 16 in order to keep the epitaxial layer at ground potential and maintain full well capacity. There is a layer of oxide over the front surface of the epitaxial layer. Preferably, the oxide layer is thicker over the interface region 12T than over the active region 12A in order to aid in isolation of the serial register 14. The thicker oxide layer over the interface region necessitates that the channel stop 20 be less highly doped adjacent the interface region than adjacent the active region.

The lateral antiblooming drain 18 is formed in generally conventional manner, with two p− barriers 22 adjacent the parallel registers respectively and an n+ drain 24 between the two p− barriers. However, instead of being connected to the reference potential, which is typically ground, through an n+ region which extends perpendicular to the parallel registers, the n+ drains are connected to the reference potential through respective discrete drain contacts 28 and a conductor 32 which extends over the front side of the device. As shown in FIG. 1, the parallel registers 12 can pass between the drain contacts to the serial register 14, and accordingly it is possible to provide two serial registers, one at each end of the parallel registers, for redundancy or for split-frame read-out. Preferably, there is a ground conductor adjacent each serial register and there are drain contacts connecting the n+ drains to each ground conductor.

A lateral channel stop composed only of a highly doped region of p++ conductivity immediately adjacent the n- signal channel is subject to disadvantage because there is a high electric field along the boundary between the n- signal channel and the p++ channel stop, and this high electric field provides a high density of regeneration and recombination sites and may lead to a high dark current.

Figure 3:
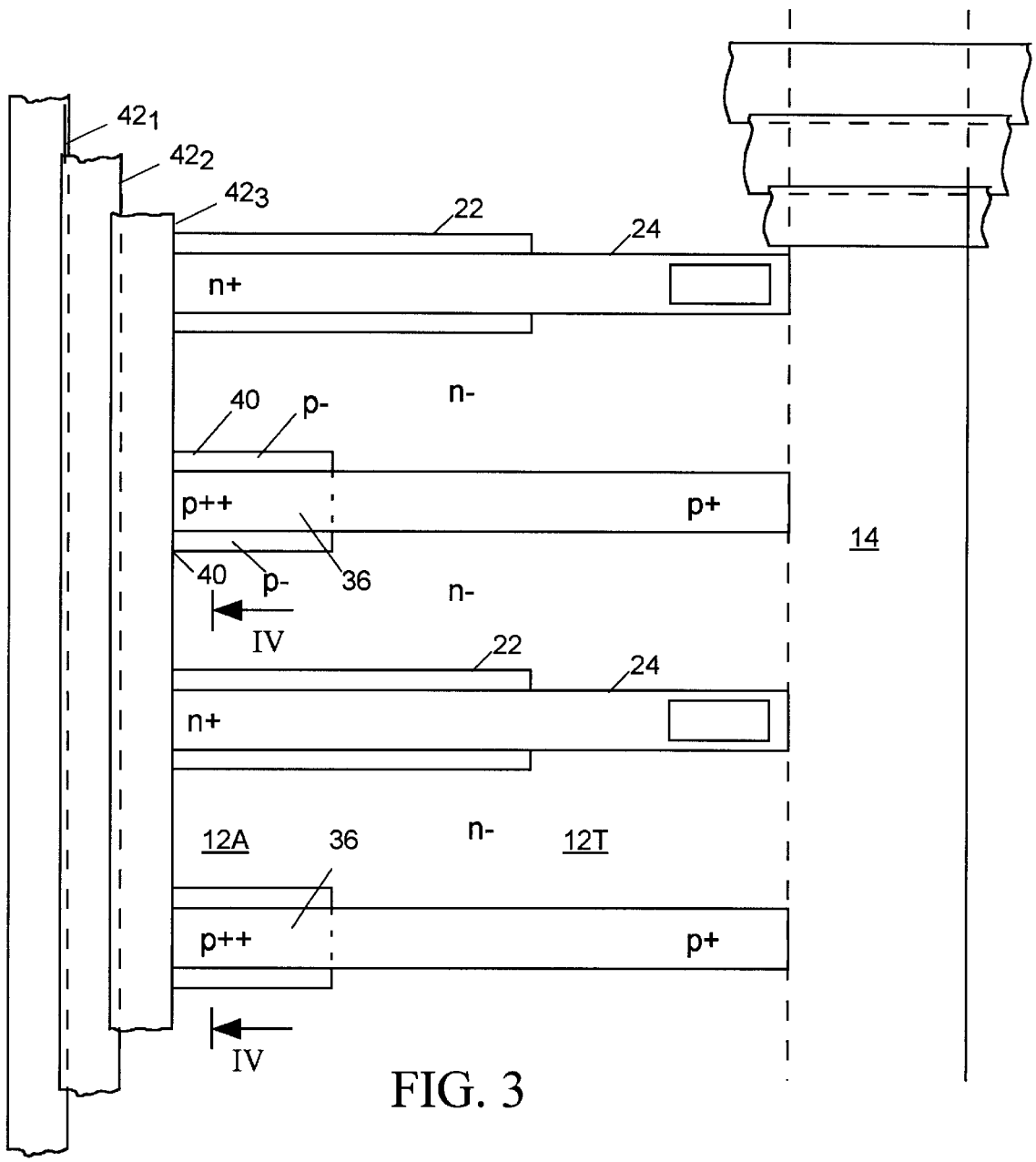
FIG. 3 is a similar view of a preferred CCD in accordance with the invention.

FIG. 3 shows a lateral channel stop composed of a highly doped region 36 of p++ conductivity and two lightly doped, depleted p- supernotch regions 40 along the edges of the region 36. In this case, the electric field at the edge of the n- signal channel is reduced and the performance degradation due to proximity of the p++ region to the n- signal channel is avoided. The geometry of the p- supernotch region 40 is such that it does not significantly impede supply of holes to the signal channel.

Since the barrier regions of the lateral antiblooming drain are of p- conductivity and the supernotch regions adjacent the p++ region are of p- conductivity, it is convenient to form the lateral antiblooming drain and the lateral channel stop using a self-aligned processing technique. This is advantageous because the possibility of periodic variations in width of the parallel registers due to misalignment of successive masks is avoided. Self-aligned processing techniques are well known and do not form part of this invention.

Figure 4:
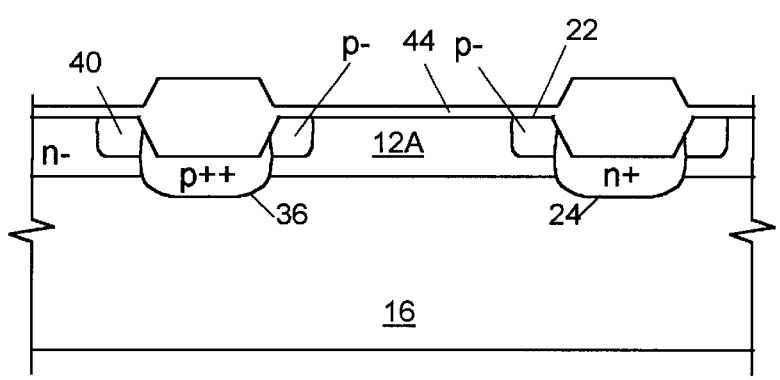
FIG. 4 is a sectional view on the line IV—IV of FIG. 3.

FIG. 4 shows an insulating layer 44 over the front side of the epitaxial layer 16. Preferably, the insulating layer 44 over the channel stops 36 and the antiblooming drains 24 is a relatively thick (typically about 2,000 Å) oxide layer and the layer over the parallel registers 12 is a thinner (about 1,000 Å) oxide or nitride layer. The thicker layer over the channel stops and antiblooming drains is provided for isolation of the polysilicon phase gates. The field oxide at the ends of the parallel registers is typically about 1 $\mu$m thick.

In the devices shown in FIGS. 1–4, the phase gates $42_1$, $42_2$ and $42_3$ are made of polysilicon. Each polysilicon phase gate is connected at one end to one of three aluminum clock buses (not shown), which are connected to an off-chip clock driver for applying the proper potentials to the phase gates to control transfer of photoelectrically generated charge in the parallel register 12. Connection to the clock driver is effected by way of three clock bus bonding pads to which the three aluminum clock buses are respectively connected. The electrical resistance of the polysilicon affects the propagation of the clock signals over the phase gates from the aluminum clock buses. Distortion of the clock signals due to the electrical resistance of the phase gates 42 limits the clock frequency that can be applied to the phase gates without reducing the clock amplitude and impairing charge transfer efficiency.

Figure 5:
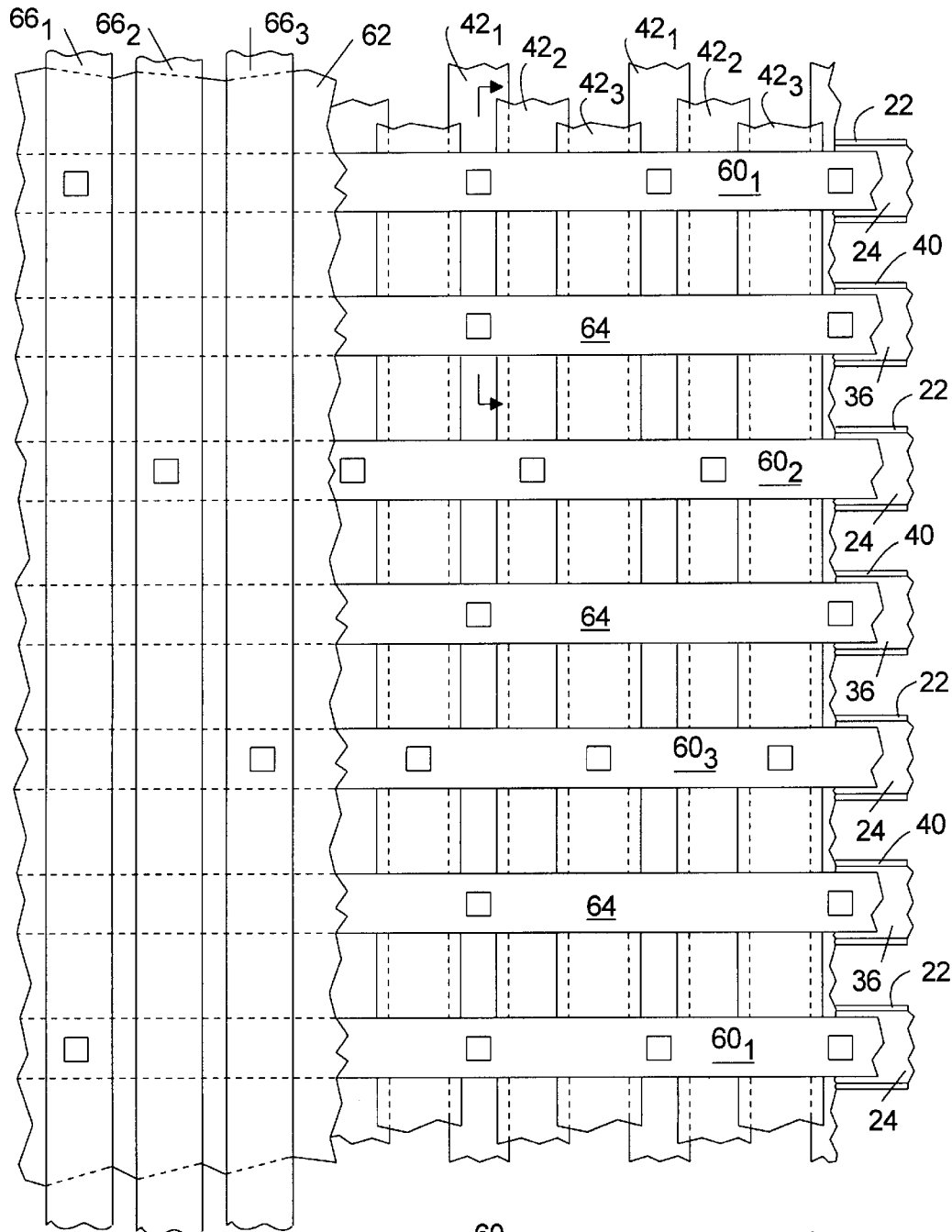
FIG. 5 is a schematic plan view of a development of the CCD shown in FIGS. 3 and 4.
Figure 6:
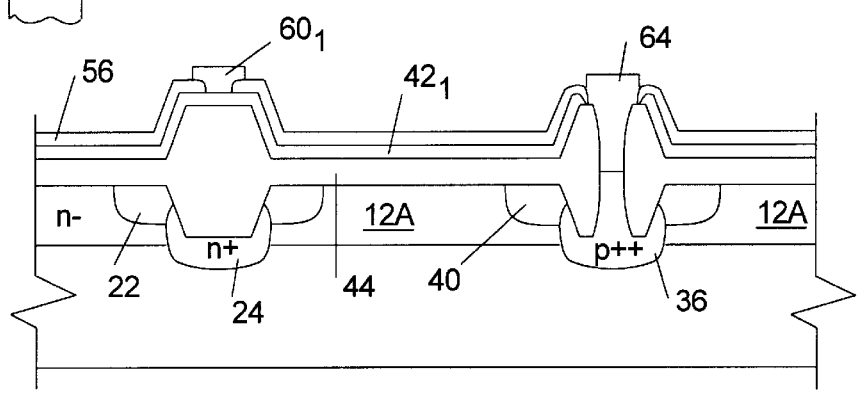
FIG. 6 is a sectional view of FIG. 5.

In accordance with the modification shown in FIGS. 5 and 6, the phase gates that are connected to each clock bus are interconnected by aluminum straps 60. The polysilicon phase gates 42 extend over the insulating layer 44, extending perpendicular to the antiblooming drains and the channel stops, and an additional layer of oxide 56 is formed over the phase gates and is formed with apertures over the antiblooming drain oxide. The phase gate straps 60 are formed over the antiblooming drain oxide and make contact with the respective phase gates through the apertures in the oxide layer 56. As shown in FIG. 6, the phase gate strap $60_1$, for example, makes electrical contact with the phase gate $42_1$ through the apertures in the oxide layer 56. As shown in FIG. 5, over a sequence of three adjacent antiblooming drains, the three straps $60_1$, $60_2$ and $60_3$ interconnect the phase 1 gates, the phase 2 gates and the phase 3 gates respectively.

The phase gate straps 60 are formed by depositing a layer of aluminum over the oxide layer 56 and then patterning the aluminum layer to define three phase gate straps. A further oxide layer 62 is deposited over the phase gate strap layer and is patterned to define three sets of openings, over the straps $60_1$, $60_2$ and $60_3$ respectively. A further layer of aluminum is deposited over the last oxide layer and is patterned to define three phase gate strap buses 66. The openings in the oxide layer 62 are positioned so that the phase gate strap bus $66_1$, is connected to the phase gate straps $60_1$, the phase gate strap bus $66_2$ is connected to the straps $60_2$ and the phase gate strap bus $66_3$ is connected to the straps $60_3$. The three phase gate strap buses 66 are connected to the clock bus bonding pads respectively. In this manner, each phase gate strap 60 is connected electrically through a continuous aluminum conductor path to the appropriate clock bus bonding pad. The arrangement of the phase gate straps 60 and the phase gate strap buses 66 significantly reduces the effective electrical resistance of the phase gates 42.

Furthermore, the effective resistance of the channel stops can be reduced by providing aluminum straps that extend along the channel stop and are connected to the channel stop implant. Referring again to FIG. 6, the insulating layer 44 is formed with an aperture through which the channel stop implant 36 is exposed and the phase gate $42_1$ is formed with an aperture corresponding to the opening in the insulating layer 44. The channel stop strap 64 makes contact with the channel stop implant 36 through the apertures in the insulating layer 44, phase gate $42_1$ and oxide layer 56.

The straps 60 and 64 are shown in FIGS. 5 and 6 as being narrower than the antiblooming drains and channel stops, so that they do not encroach on the thin oxide 42. In the case of a front illuminated device this would ensure that the straps do not mask the active region of the device. However, since the device shown in FIGS. 5 and 6 is back illuminated, the straps 60 and 64 could encroach on the thin oxide without degrading photoelectric conversion.

It will be appreciated that the invention is not restricted to the particular embodiments that have been described, and that variations may be made therein without departing from the scope of the invention as defined in the appended claims and equivalents thereof.

What is claimed is:

1. A back thinned charge-coupled device (CCD) having at least first and second parallel n- signal channel segments, a p++ channel stop region between the signal channel segments, and first and second p- isolation regions extending alongside the p++ region, adjacent the first and second signal channel segments respectively.

2. A CCD according to claim 1, having a third n- signal channel segment parallel to the first and second signal the first and third signal channel segments, an n+ antiblooming drain between the second and third signal segments, and first and second p- barrier regions extending alongside the n+ antiblooming drain, adjacent the second and third signal channel segments respectively.

3. A CCD according to claim 1, having a third n− signal channel segment parallel to the first and second signal channel segments, the second signal channel segment being between the first and third signal channel segments, and an n+ antiblooming drain between the second and third signal channel segments.

4. A CCD according to claim 3, comprising first and second p− barrier regions extending alongside the n+ antiblooming drain, adjacent the second and third signal channel segments respectively.

5. A CCD according to claim 3, having multiple phase gates over an active region of a front side of the device, and comprising a phase gate strap interconnecting at least two phase gates of at least one phase, and wherein the phase gate strap is disposed over the antiblooming drain.

6. A CCD according to claim 1, having multiple phase gates over an active region of a front side of the device, and comprising a channel stop strap extending over the phase gates and connected to the p++ channel stop region.

7. A CCD according to claim 1, having multiple phase gates over an active region of a front side of the device, and comprising a phase gate strap interconnecting at least two phase gates of at least one phase.

8. A CCD according to claim 1, having a third n− signal channel segment parallel to the first and second signal channel segments, the second signal channel segment being between the first and third signal channel segments, and an n+ antiblooming drain between the second and third signal channel segments.

9. A CCD according to claim 1, having multiple phase gates over an active region of a front side of the device, and comprising a first phase gate strap interconnecting at least two phase gates of one phase, a second phase gate strap interconnecting at least two phase gates of said one phase, and a phase gate strap bus interconnecting the first and second phase gate straps.

10. A back thinned charge-coupled device (CCD) having at least first, second and third parallel signal channel segments, the second signal channel segment being between the first and third signal channel segments, a channel stop region between the first and second signal channel segments, and an antiblooming drain between the second and third signal channel segments, the CCD comprising a discrete drain contact connected to the antiblooming drain and a conductor extending over a front side of the device for connecting the discrete drain contact to a reference potential level.

11. A CCD according to claim 10, comprising first and second p− barrier regions extending alongside the n+ antiblooming drain, adjacent the second and third signal channel segments respectively.

12. A CCD according to claim 10, having multiple phase gates over an active region of the front side of the device and comprising a phase gate strap interconnecting at least two phase gates of at least one phase, and wherein the phase gate strap is disposed over the antiblooming drain.

13. A back thinned charge-coupled device (CCD) having at least first and second parallel signal channel segments, a channel stop region between the signal channel segments, and multiple phase gates over an active region of a front side of the device, and the CCD comprising a channel stop strap extending over the phase gates and connected to the channel stop region.

14. A charge-coupled device (CCD) having multiple phase gates over an active region of a front side of the device, and comprising a first phase gate strap interconnecting at least two phase gates of one phase and a second phase gate strap interconnecting the phase gates that are interconnected by said first phase gate strap.

15. A charge-coupled device (CCD) having a plurality of parallel signal channel segments, M sets of N phase gates extending over an active region of a front side of the device, where M and N are integers greater than two and each set of N phase gates includes a phase i (i=1 . . . N) phase gate, and two phase gate straps extending over the phase gates and interconnecting the M phase i phase gates.

16. A CCD according to claim 15, wherein the signal channel segments are spaced apart transverse to each other and each phase gate strap is disposed between two adjacent signal channel segments.

17. A CCD according to claim 15, further comprising N phase gate strap buses, and wherein the ith phase gate strap bus interconnects the phase gate straps that interconnect the phase i phase gates.

18. A charge-coupled device (CCD) having at least first and second parallel signal channel segments, an antiblooming drain between the first and second signal channel segments, and multiple phase gates over an active region of a front side of the device, and comprising a phase gate strap interconnecting at least two phase gates of at least one phase, and wherein the phase gate strap is disposed over the antiblooming drain.

19. A back thinned charge-coupled device (CCD) having at least first and second pairs of parallel signal channel segments, a first antiblooming drain between the signal channel segments of the first pair, and a second antiblooming drain between the signal channel segments of the second pair, and the CCD comprising first and second discrete drain contacts connected to the first and second antiblooming drains respectively and a conductor extending over a front side of the device and interconnecting the first and second discrete drain contacts.

* * * * *

UNITED STATES PATENT AND TRADEMARK OFFICE
CERTIFICATE OF CORRECTION

PATENT NO.    : 6,369,415 B1
DATED         : April 9, 2002
INVENTOR(S)   : James R. Janesick It is certified that error appears in the above-identified patent and that said Letters Patent is hereby corrected as shown below:

<u>Column 4,</u>
Line 62, -- channel segments, the second signal channel segment being between -- should be inserted after "signal".
Line 64, -- channel -- should be inserted after "signal".

Signed and Sealed this

Seventeenth Day of September, 2002

Attest:

JAMES E. ROGAN
Attesting Officer
Director of the United States Patent and Trademark Office